United States Patent
Figuet et al.

(10) Patent No.: US 6,959,863 B2
(45) Date of Patent: Nov. 1, 2005

(54) METHOD FOR SELECTIVELY TRANSFERRING AT LEAST AN ELEMENT FROM AN INITIAL SUPPORT ONTO A FINAL SUPPORT

(75) Inventors: Christophe Figuet, Fontaine (FR); Bernard Aspar, Rives (FR); Vincent Blet, Meylan (FR)

(73) Assignee: Commissariat a l'Engergie Atomique, Paris (FR)

( * ) Notice: Subject to any disclaimer, the term of this patent is extended or adjusted under 35 U.S.C. 154(b) by 0 days.

(21) Appl. No.: 10/473,813

(22) PCT Filed: Apr. 2, 2002

(86) PCT No.: PCT/FR02/01132

§ 371 (c)(1),
(2), (4) Date: Oct. 2, 2003

(87) PCT Pub. No.: WO02/082502

PCT Pub. Date: Oct. 17, 2002

(65) Prior Publication Data

US 2004/0104272 A1 Jun. 3, 2004

(30) Foreign Application Priority Data

Apr. 3, 2001 (FR) ............................................. 01 04502

(51) Int. Cl.$^7$ ............................. G06K 7/08; H01L 21/00
(52) U.S. Cl. .......................................... 235/449; 438/25
(58) Field of Search ............................. 235/449; 438/25, 438/691, 106, 118, 64, 67, 406, 458, 464

(56) References Cited

U.S. PATENT DOCUMENTS

| | | | |
|---|---|---|---|
| 5,244,818 A | * | 9/1993 | Jokerst et al. ................. 438/25 |
| 5,391,257 A | | 2/1995 | Chang et al. |
| 5,641,714 A | | 6/1997 | Yamanaka |
| 6,013,534 A | | 1/2000 | Mountain |
| 6,027,958 A | | 2/2000 | Cheong et al. |
| 6,143,117 A | | 11/2000 | Kelly et al. |
| 6,183,588 B1 | | 2/2001 | Kelly et al. |
| 6,204,079 B1 | | 3/2001 | Aspar et al. |
| 6,214,733 B1 | * | 4/2001 | Sickmiller ................... 438/691 |

FOREIGN PATENT DOCUMENTS

| | | |
|---|---|---|
| EP | 1 041 620 | 10/2000 |
| FR | 2 781 925 | 2/2000 |
| JP | 07-078795 | 3/1995 |
| JP | 07-105285 | 4/1995 |
| JP | 2000-150544 | 5/2000 |

* cited by examiner

Primary Examiner—Daniel Stcyr
Assistant Examiner—Daniel A. Hess
(74) Attorney, Agent, or Firm—Oblon, Spivak, McClelland, Maier & Neustadt, P.C.

(57) ABSTRACT

The invention concerns a process of selective transfer of labels from an initial support to a final support, each label including at least one element constituent of a microelectronic and/or optoelectronic and/or acoustic and/or mechanical device, with the elements made in a surface layer of the initial support, and the process including the following stages:

a) Fixing a transfer support on the surface layer of the initial support;
b) Eliminating the part of the initial support that does not correspond to the surface layer;
c) Laterally defining the labels by cutting according to the thickness of the surface layer, with the cutting leaving zones to be broken off;
d) Grasping one or several labels to be transferred and tearing them off by means of energy intake in the corresponding zones that can be broken off;
e) Transfer and fixing the label or set of labels torn off in stage d) on the final support.

27 Claims, 6 Drawing Sheets

METHOD FOR SELECTIVELY TRANSFERRING AT LEAST AN ELEMENT FROM AN INITIAL SUPPORT ONTO A FINAL SUPPORT

BACKGROUND OF THE INVENTION

1.—Field of the Invention

The abovementioned invention concerns the selective transfer of one or several elements we can call labels, from a manufacturing support to a receiving support.

It concerns, in particular, the transfer of semi-conducting chips, partially or fully completed, from their initial substrate on which they are manufactured to a new substrate (or receiving support) that can itself be treated by microelectronic techniques.

The invention enables us, in particular, to transfer chips that may have been electronically tested, for example, chips of 1 mm$^2$ to 1 cm$^2$ area, from their initial substrate to a support made of treated or non-treated semi-conducting material, transparent material, (example: glass), a soft or rigid support (example: plastic) or a support made of ceramics. It also enables us, for example, to transfer optoelectronic components such as a vertical cavity surface emitting lasers or VCSEL or small pieces of III–V semi-conductor from their initial substrate on silicon small plates that can be prepared according to microelectronic techniques in order to obtain III–V semi-conductor elements on silicon.

It can also apply to the transfer of electronic circuits, electronically tested and thinned down if necessary, on a plastic card by means of glue to make smart cards.

2.—Description of the Prior Art

There exist several methods of transferring semi-conducting chips or group of chips to a receiving support. We can mention the technique called "epitaxial lift off", organic or mineral gluing (by molecular adhesion) and the technique called "flip-chip". This latter method does not enable us to handle individual components of small dimension or extreme thinness as with the two previous ones.

The technique of mineral gluing or molecular adhesion is well known for numerous materials. Molecular adhesion includes two different types of gluing: absorbent gluing and hydrophobic gluing. In the case of absorbent gluing, the gluing results from the evolution of the interaction of —OH groupings on the surface of a structure toward the formation of Si—O—Si bonds in the case of silicon oxide. The forces associated with this type of, interaction are strong. The gluing energy, in the order of 100 mJ/m$^2$ at room temperature, reaches 500 mJ/m$^2$ after annealing at 400° C. for 30 minutes. In the case of hydrophobic gluing, the gluing results from the evolution of the interaction of the —H or —F groupings on the surface of the structure towards the Si—Si bonds in the case of silicon adhesion. The gluing energy is weaker than for absorbent gluing up to temperatures in the order of 500–600° C. The gluing energy is generally determined by the blade method divulged by W. P. Maszara and al., in the article "Bonding of silicon wafers for silicon-on-insulator" published in J. Appl. Phys. 64(10), Nov. 15, 1988, pages 4943 to 4950.

The control of the gluing energies can enable us to achieve reversible molecular adhesions where, as divulged in the FR-A-2 781 925 document, the adhesion energy of the elements can be low on the transfer support and the elements to be transferred can be treated to have a stronger adhesion energy on the receiving support than on the transfer support, thus enabling us to selectively transfer an element among n. In that document, the adhesion energy is lower between the elements to be transferred and the transfer support than between the elements and the receiving support. Yet, the energy we obtain during the gluing between the elements and the receiving support is an adhesion energy at room temperature between 0 and 200 mJ/m$^2$ depending on the surface treatment and the materials used. The bonding energy between the elements to be transferred and the transfer support is therefore below 200 mJ/m$^2$. The method described in that document does not enable us to transfer elements strongly adhered on the transfer support, for example, at energy above 200 mJ/m$^2$.

FR-A-2 796 491 divulges the transfer on a final substrate, of chips individually handled on a transfer support on which they have been glued beforehand. The chips are individually handled on the transfer support, thanks to openings made through that transfer support and going through it completely. A mechanical (for example, by means of an awl), chemical or pneumatic action, or a combination, enables us to disconnect a chip from the transfer support and to have it adhered on the receiving support. This approach can apply to the low adhesion of a chip on the transfer support and to a strong one on the receiving support. It requires the preparation of a special transfer support that has been conditioned to enable the selection of each element to be transferred. In addition, it is not compatible with the standard micro-electronic equipment such as the "pick and place" equipment.

The U.S. Pat. No. 6,027,958 and WO-A-98/02921 documents divulge the transfer of fine elements processed on SOI substrate for the purpose of increasing the integration density and making the components less fragile. At first, the components are made by means of microelectronic classical technologies; then they are linked together by a metallic deposit. According to that method, the elements to be transferred are adhered on a transfer support on which a chemical stoppage layer has been deposited by an adhesive material. The initial substrate is taken out to uncover the stoppage layer. Next, the components are collectively joined on a receiving support. The transfer support is then taken out.

This method enables us to transfer a set of components in thin layers toward a receiving support. It is therefore a collective process. In that transfer method, the components are kept together with a thick support that enables us to handle them. Never can an individual component be separated from the others due to the thick substrates (initial substrate, transfer support, receiving support) that are always in contact with the components. This method does not allow the selective transfer of an element in thin layer.

The technique called "epitaxial lift-off" enables us to transfer a component in an individual manner. The first step consists in making by epitaxy, components to be transferred (see American patent No. U.S. Pat. No. 4,883,561 in the case of a simple transfer). The epitaxial layers can be inverted (see the American patent No. U.S. Pat. No. 5,401,983 in the case of double transfer). Before the formation of all the layers making up the component, a sacrificial layer is epitaxed on the growth substrate. The labels are defined by photolithography. A resin is deposited on the labels so as to curve them and give them a concave structure for the renewal of the under-engraving and the evacuation of the attacking residues. The sacrificial layer is then chemically attacked by wet process. Since the film formed by the epitaxed layers is curved by the resin, the film bends down little by little, which enables the attacking solution to penetrate the cracks in formation between the film and the substrate. When the attack is over, the film can be recovered by means of vacuum pliers and then transferred on a target substrate (see the American patent No. U.S. Pat. No. 4,883,561) or on a transfer support (see the American patent No. U.S. Pat. No. 5,401,983). After the transfer, the resin is chemically removed; then the labels, transferred on the receiving substrate, are submitted to thermal treatment under pressure to remove the gas trapped in the interface.

In that technique, the sacrificed layer is an epitaxed layer; hence the name "epitaxial lift-off". The elements can be individually or collectively transferred on a transfer support and be made interdependent by Van der Waals forces on a receiving support, then re-fired once the transfer support has been removed. The main advantage of this technique is that it recovers the initial substrate. However, due to the lateral under-engraving of the sacrificial layer, the dimensions of the chips to be transferred are limited. The article of E. YABLONOVITCH and al., Appl. Phys. Lett. 56(24), 1990, page 2419 mentions a maximal size of 2 cm×4 cm and quite long attacking times. The maximum speed is 0.3 mm/h in the case of low lateral dimensions (below 1 cm). Furthermore, since that attacking speed depends on the curve of the elements to be transferred for the discharge of the attacking residues, it restricts the thickness of the transferable components to 4.5 $\mu$m (see the article of K. H. CALHOUN and al., IEEE photon. Technol. Lett., February 1993).

The "lift-off" technique has been known for many years (see, for example, the American patent No. U.S. Pat. No. 3,943,003). This technique includes depositing a thick photosensitive resin on a substrate, exposing and opening that resin at places we wish to deposit a material, which, generally, is a metal. The material is deposited by a cold depositing method (generally by pulverization) on the whole surface of the substrate. The material deposited really only adheres at the places where the resin has been opened. The resin is then dissolved in a solvent (for example, acetone) and only the adhering parts of the material remain.

Other methods are proposed in the document EP-A-1 041 620. They enable us to transfer thin chips on a host support. These methods are based on the individual treatment of the chips. The chips are glued one by one on a transfer support, are individually made thinner and are then transferred on a host support. It is not a collective treatment for the thinning, followed by an individual transfer from the substrate.

SUMMARY OF THE INVENTION

The purpose of the invention is to selectively transfer labels (that is to say, one element or a group of elements) preferably in thin homogeneous or heterogeneous layers from an initial support that may be a manufacturing support, to a final support. It enables us, in particular, to transfer electronic chips that may be manufactured from any semi-conducting material. It can be one or several VCSEL type lasers, one or several photo-detectors in cavity, or a combination of photo-detectors and lasers. It can also be one or several electronic components, circuits for smart cards, thin film transistors, memory devices or a combination of components with an opto-electronic, electronic or mechanical (MEMS) function between them, etc.

The invention allows the transfer of a chip made up of one or several VCSEL lasers electronically manufactured and tested on a manufacturing substrate (in GaAs or InP, for example) to a reading and addressing circuit made on silicon. In another application, the invention allows the transfer of opto-electronic components on a receiving support with only an optical function such as a glass, a wave guide, etc. It also allows the transfer of a semi-conductor element made up of an electronic circuit on a receiving support that is used for the handling of the functions carried out by the electronic circuit, such as smart cards. This transfer has several advantages, the main one being that it can integrate an electronic or optical or opto-electronic or mechanical function on a substrate which cannot be achieved with the required quality by epitaxy, by deposit or by any other means used in micro-electronics.

It is obvious that the epitaxial growth of the components with a great difference in link parameters (several for hundreds) cannot be achieved with a quality that would prevent the degradation of their electrical and optical characteristics due to the presence of structural defects. In another area, it is obvious that we cannot, with micro-electronic processes, make components on plastic supports, firstly, because the latter do not withstand the temperatures used and secondly, because they are not by nature, compatible with the cleanliness criteria of front-end stages in the semi-conductor industry.

In addition, the invention enables us to associate a thin component on a support by using a joint by molecular adhesion that is compatible with the "front-end". This allows us to treat the component after transfer with processes such as with high temperatures, for example. In this way, for example, we can resume an epitaxy or carry out the connections between the component and the support.

The transfer of labels also enables us to free ourselves from the differences in diameter between the substrates on which the components are made. This enables us, in particular, to limit the losses of starting material as compared with a full plate transfer where only certain zones transferred are used to make components.

Another advantage of transferring labels of manufactured components is to be able to transfer an electronically tested circuit and, therefore, to transfer only good components.

In addition, the transfer of thinned components has the advantage of reducing the vertical obstruction, reducing the weights of these components and, furthermore, making them less fragile. But the transfer of thin layers or films is made difficult by their small size that makes them hard to handle. To facilitate that handling, it is advantageous to use a transfer support that is used as a rigidificator for the handling of these films, to avoid their bending out of shape under constraint, or even breaking. By rigidificator, we mean any organic or mineral support with a rigidity that prevents the breaking of pre-cut zones, allows the support of the set of chips and prevents splits and/or fractures and/or breakings of labels or elements to be transferred. That rigidificator can be, for example, a mono-crystalline silicon plate (001) with a minimum thickness of 200 $\mu$m. It can also be made of glass or any transparent material, for example in visible, infrared or ultraviolet. This, in particular, makes the alignment of the chip on the support possible. This also allows the treatment of the adhesion layer (for example: glue that can be hardened with ultraviolet rays).

The rigidificator used to transfer the labels can be a support commonly used in micro-electronics (mono-crystalline or poly-crystalline substrate, glass, etc.) or other supports such as plastic films sensitive to ultraviolet rays, double-face films, stretchable films, Teflon® films, etc. It can be a combination of these different supports allowing a better usage of the properties of each of them.

The rigidificator must be able to handle the set of chips to be transferred during the collective stages. It must be able to selectively free one element among all those being prepared. For this, a pre-cutting is done in all or part of the layers of elements to be transferred and on all or part of the rigidificator. Thus a zone maintaining the integrity of the whole is maintained, and it is possible to selectively separate the elements to be transferred by local supply of mechanical and/or thermal and/or chemical energy, for example.

The purpose of the invention is also to provide an economical process to transfer components.

The purpose of the invention concerns a process of selectively transferring labels from an initial support to a final support, with each label made up of at least one element being part of a micro-electronic and/or opto-electronic and/or acoustic and/or mechanical device, the elements being made in a surface layer of the initial support and the process including the following stages:

a) Fixing of a transfer support on the surface layer of the initial support;
b) Elimination of the part of the initial support that does not correspond to the surface layer;
c) Lateral definition of the labels, on the set made up by the transfer support and the surface layer, by a cutting done according to the thickness of the surface layer, with the cutting leaving zones that can be broken off;
d) Grasping of one or several labels to be transferred and tearing them off by energy input in the corresponding zones to be broken off, with the energy input resulting in the breaking off of these zones;
e) Transferring and fixing the label or the set of labels torn off in stage d), on the final support.

By constituent element, we must understand a minimum of one layer of material that can be treated before or after transfer or be used as such. The material can be chosen among the semi-conducting materials (Si, SiC, GaAs, InP, GaN, HgCdTe), the piezoelectric ($LiNbO_3$, $LiTaO_3$), pyroelectric, ferroelectric, magnetic or even insulating materials.

If the surface layer is in addition made up of an adhesion layer covering the said elements, stage a) may include the fixing of the transfer support on the adhesion layer. The adhesion layer can be a double face adhesive film or a material chosen among glues, for example, a polymer-type glue (for example, polymide, BCB, epoxy-type or photosensitive resin), a wax, silicon oxide (SOG, PECVD or thermal type, for example) and silicon. If it covers the elements, it can be a layer deposited and polished.

In stage a), the fixing can be done by molecular adhesion, with that molecular adhesion reinforced by a thermal treatment.

In stage b), the elimination of part of the initial support that does not correspond to the surface layer can be carried out by one or several methods chosen among the following: mechanical rectification, polishing, dry or wet chemical attack, breaking along a weakened layer.

In stage c), the cutting can be done by dry or wet chemical engraving, sawing, ultrasounds, cleaving or laser beam.

In stage d), the grasping is carried out by mechanical means, capillarity, electrostatic means or preferably by pneumatic (aspiration, for example) and/or chemical means.

In stage d), the energy input can be an input of mechanical and/or thermal and/or chemical energy. The tearing off can be done by combining the effects of pressure and aspiration on the label(s) to be transferred.

Advantageously, in stage e), the fixing is obtained by molecular adhesion or by gluing. The gluing can be done by means of glue, epoxy resin or a reactive or non-reactive metal layer.

After stage a), the part of the transfer support corresponding to the label transferred or to the set of labels transferred can be removed, at least partially. That removal can be done by one or several methods chosen among the following: the lift-off technique, the chemical attack or the selective attack of the adhesion layer, the application of mechanical forces and the breaking off along a weakened layer. The weakened layer is obtained, for example, by the creation of microcavities and/or gaseous micro-bubbles obtained by ionic implantation or, for example, by the presence of a buried porous layer or by any other means that allows for the separation of the surface layer from the initial support.

Before stage c), we could add to the transfer support, means enabling us to maintain that support rigid during stage c). After stage c), the means to rigidify the transfer support can be removed at least partially.

These means can be mechanically bent out of shape, with the bending making the breaking easier in the breaking zones. These means can also be plastic films.

The surface layer can include at least one stoppage layer adjacent to the part of the initial support that does not correspond to the surface layer. This stoppage layer can also be removed.

Before stage a) the said element constituent of a microelectronic and/or opto-electric and/or acoustic and/or mechanical device can be tested to assess its working condition.

In stage a), the fixing of the transfer support can be obtained by depositing a layer of material on the surface layer, with that layer of material forming the transfer support.

In stage c), the cutting can be done from the surface layer and/or from the transfer support.

Before fixing the label on the initial support, a surface preparation can be made to improve the fixing (cleaning, removal of a sacrificial layer, polishing). During the fixing of the final support, the label can in addition be aligned on that support by using either pre-established markings on the labels and support, or preferably a transfer support made of transparent material.

After stage e), we can plan for a stage enabling us to disclose the said element constituent of an active or passive micro-electronic device and/or opto-electronic and/or a sensor.

If the initial support is of the SOI type, that is to say, made up of a silicon substrate successively supporting a silicon oxide layer and a silicon layer in which the said element is made, the silicon oxide layer is used as a stoppage layer.

BRIEF DESCRIPTION OF THE DRAWINGS

The invention will be better understood and other advantages and particularities will appear while reading the following description, given as an non-exhaustive example, accompanied by drawings in appendix among which.

DETAILED DESCRIPTION OF THE PREFERRED EMBODIMENTS OF THE INVENTION

Generally speaking, the process applies to elements fully or partially made on substrates by the techniques of microelectronics and/or optoelectronics. The elements can possibly be made on one or several layers of chemical stoppage. They can possibly be subjected to an electric test on their initial support.

In case there exists a strong surface topology, a polishing of the surface can be carried out by the deposit of material followed by a chemical-mechanical polishing or by filling the volumes with a material sufficiently smooth that does not require any subsequent polishing. If the layer of filling material is sufficiently thick and rigid, it can also fulfil a function of rigidification and make up the transfer support. In addition, it can, when necessary, fulfil an adhesion function.

Different techniques can be used to fix the transfer support on the initial support: molecular adhesion, glue, epoxy resin, etc. The molecular adhesion is particularly appropriate when the surfaces to come into contact are smooth. An adhesion layer can be useful to fix the surface layer on the transfer support. It can be made of a material chosen among a double-face adhesive film, glue such as polymer-type (polymide, BCB, epoxy or photosensitive resin), wax, glass, spin on glass silicon oxide, deposited or thermal.

The grasping of the labels can be done by a classical pick and place technique or any other technique by which the label is held and energy is locally introduced to induce the breaking of the label to be transferred. Advantageously, the label is handled with a tool that can suck it up while exerting a pressure to have it separated from the other labels. The tool enables us to transfer the torn off label on the final support.

Preferably, the transfer support is a substrate used in microelectronics and cheap, for example, monocrystalline or polycrystalline silicon, glass, sapphire, . . . .

The elements can be made on an initial support made up of several stoppage layers. The usage of several stoppage layers is advantageous to smoothen the surface resulting from the chemical attack of the initial support. The usage of several stoppage layers can also enable us to remove the particles resulting from the vertical weakening of the labels to be transferred and possibly of the transfer support.

A first example of application of the invention is illustrated in FIGS. 1A to 1J that are partial section views.

Figure 1A:
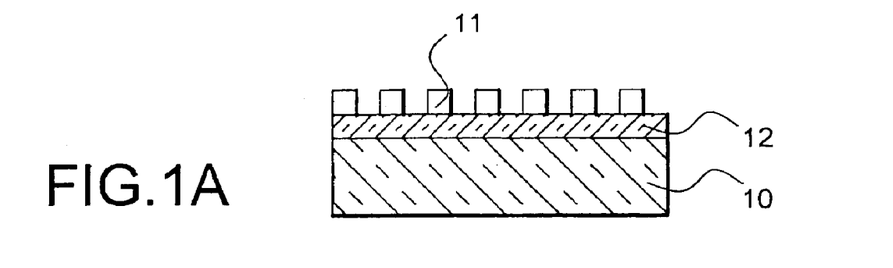
FIGS. 1A to 1J are transversal section views illustrating a first example of implementation of the selective transfer process according to the invention.

FIG. 1A shows a substrate 10, for example in GaAs, used as an initial support and on which semi-conducting chips 11 have been made (for example: opto-electronic or micro-electronic components) according to techniques known to the expert. Chips 11 are separated from the rest of the initial support by at least one stoppage layer 12 for example in $Al_xGa_{(1-x)}As$. That stoppage layer provides better homogeneity in the transfer since it forms a stoppage layer and a sacrificial layer, for example, in relation to dry or wet chemical engraving.

Figure 1B:
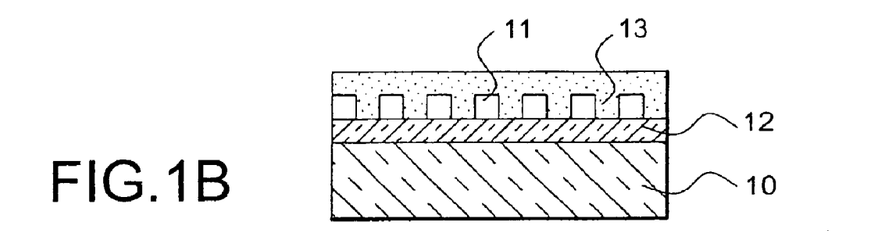

As shown in FIG. 1B, the substrate surface 10 including the chips 11 is smoothened to allow gluing on a transfer support. This operation can be obtained by the deposit or the spreading of a layer 13 that can be made of glue, epoxy resin or a mineral material such as glass, silica or silicon. A planarization of the layer 13 may be necessary. The stoppage layer 12, the elements or semiconducting chips 11 and the layer 13 form the surface layer of the initial support.

Figure 1C:
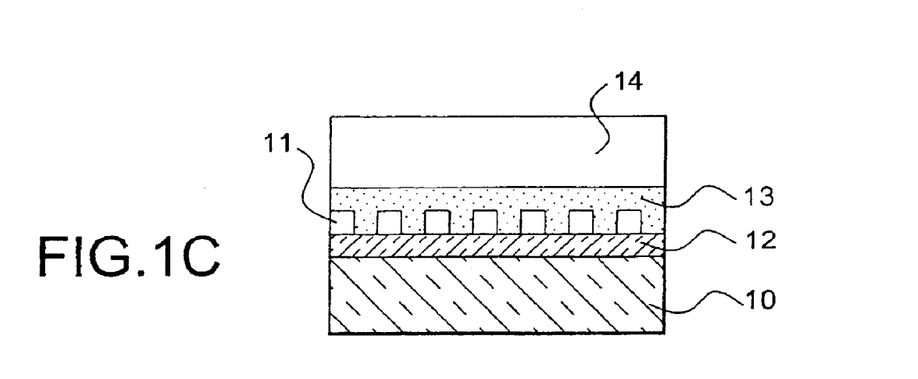

In FIG. 1C, a transfer support 14 is glued on the free face of the layer 13. If the layer 13 is an epoxy resin layer, it is then polymerized. If the layer 13 is a mineral layer, a thermal treatment enables us to increase the adhesion energy to the transfer support 14.

Figure 1D:
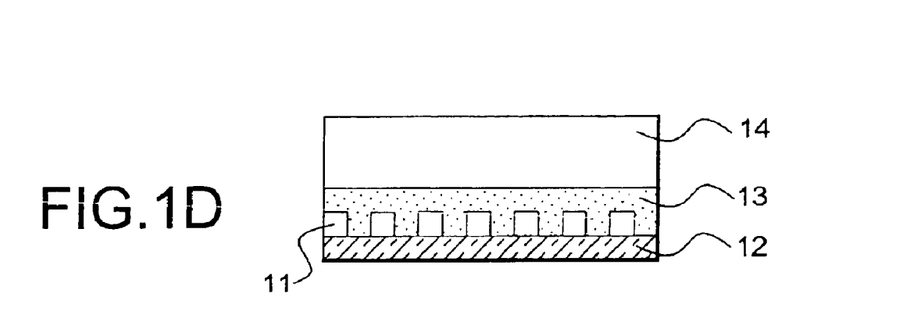

FIG. 1D shows that the initial support 10, more exactly the part of the initial support that does not correspond to the surface layer, has been removed. This removal can be done by a classical method or a combination of classical methods: mechanical rectification, polishing or dry or wet chemical attack. The substrate may have been weakened in depth by ionic implantation of ions or gas before completion of the component. The separation of the substrate thin layer can then be obtained by input of mechanical energy (see document FR-2 748 851).

Figure 1E:
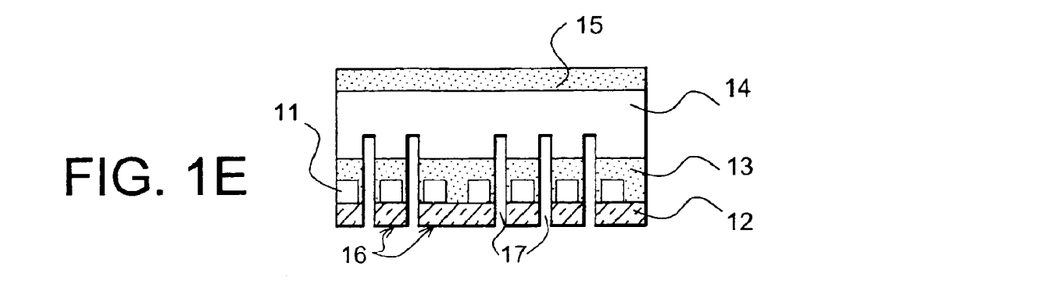

As shown in FIG. 1E, a piece of rigidification 15 is fixed on the free face of the transfer support 14. That piece 15 can be a cutting support. The labels to be transferred are then pre-cut vertically by cuttings 17. A label 16 to be transferred includes at least one chip 11. The pre-cut of labels is carried out fully in the layers 12 and 13 and partially in the transfer support 14. The pre-cut leaves zones that can be broken off in the transfer support 14. This pre-cut can be done by chemical engraving, by means of a circular saw, a disc saw, a thread saw or by ultrasounds. Depending on the application, the device can be completed before or after transfer on the final support.

Figure 1F:
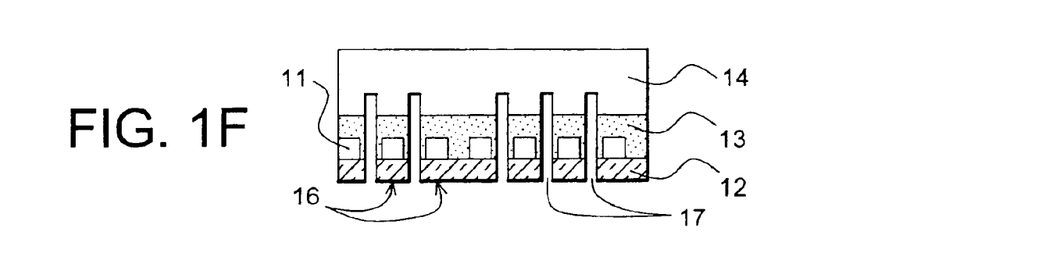
Figure 1G:
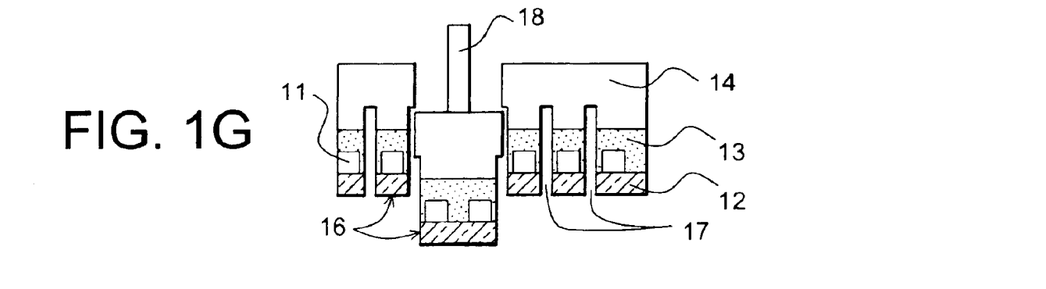
Figure 1H:
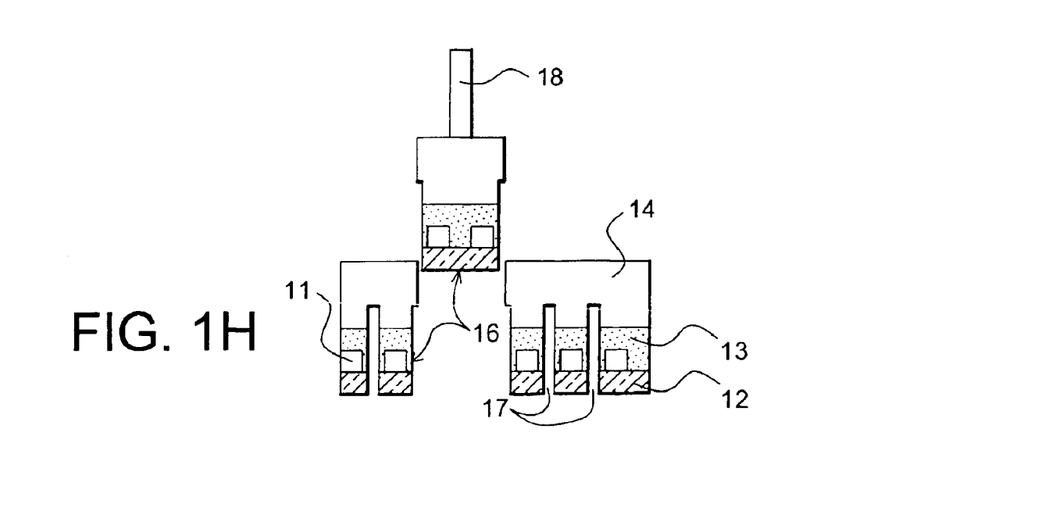

The free face of the stoppage layer 12 is chemically treated to eliminate the particles and contaminating elements that may have appeared during the previous operations and would make this face unfit for molecular adhesion. If several stoppage layers have been planned, one or several of these layers can be removed chemically by dry or wet method or even by mechanical-chemical polishing to simultaneously remove the pollutants present on the surface. Furthermore, since the rigidification piece 15 (see FIG. 1E) is not necessarily compatible with the chemical treatments a surface needs to be subjected to for its molecular adhesion, the piece 15 can be removed just after making the cutting 17 as shown in FIG. 1F.

Labels 16 to be transferred are then taken selectively (see FIGS. 1G and 1H), with the breaking zones breaking under pressure, vacuum extraction, sequence of pressures and vacuum extraction, sequence of pressure and pressure release, sequence of vacuum extraction and vacuum release. Preferably, the breaking is done by the sudden pressure of a tool 18, enabling us to handle the label to be transferred, for example, an empty pliers adapted to the dimensions of the chips.

Figure 1I:
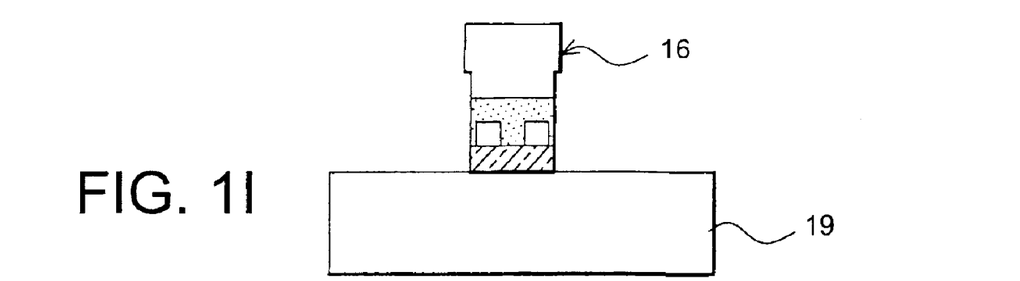

The removed label 16 is then fixed on a final support 19 by molecular adhesion as shown in FIG. 1I. The final support 19 may have been subjected to microelectronic surface preparation to allow a molecular adhesion of the label 16, for example, an absorbent-type chemical cleaning or a mechanical chemical polishing.

The material of the layer 13 is then removed by under-engraving, which results in separating the part of the transfer support transferred together with the rest of the label. This part of the transfer support can also be removed by shearing, and the material of the layer 13 can then be removed by chemical attack. We obtain the structure shown in FIG. 1J.

A second example of the application of the invention is illustrated by the FIGS. 2A to 2I that are partial section views.

Figures 1J, 2A:
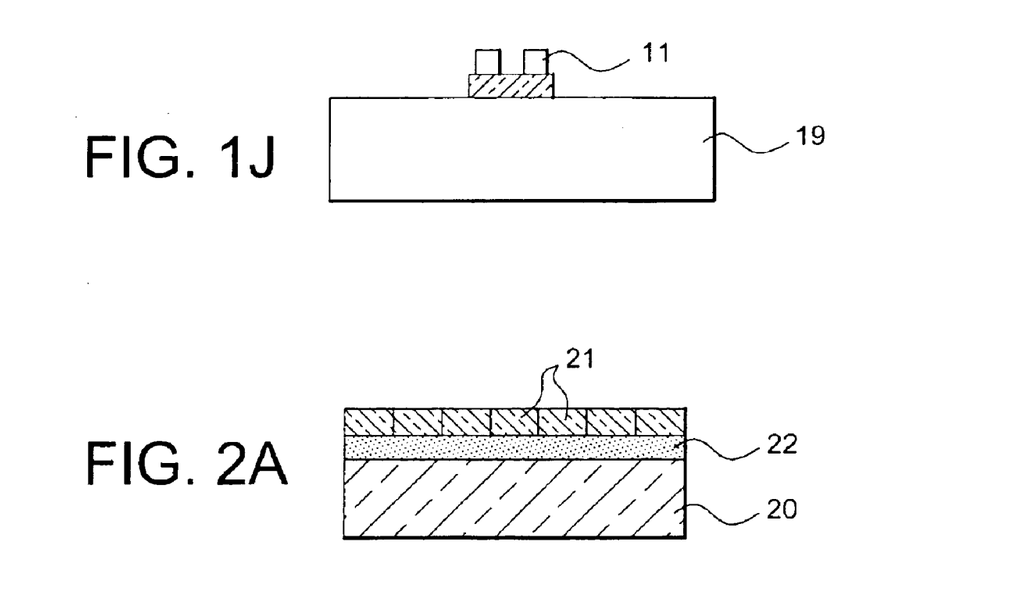
FIGS. 2A to 2I are transversal section views illustrating a second example of implementation of the selective transfer process according to the invention.

FIG. 2A shows a substrate 20 used as initial support. The substrate 20 is a SOI substrate made up of a silica layer 22 used as a chemical stoppage layer, and a thin silicon layer in which semiconducting 21 chips have been made according to techniques known to the expert. The silica layer 22 and the thin silicon layer make up the surface layer of the initial support.

Figure 2B:
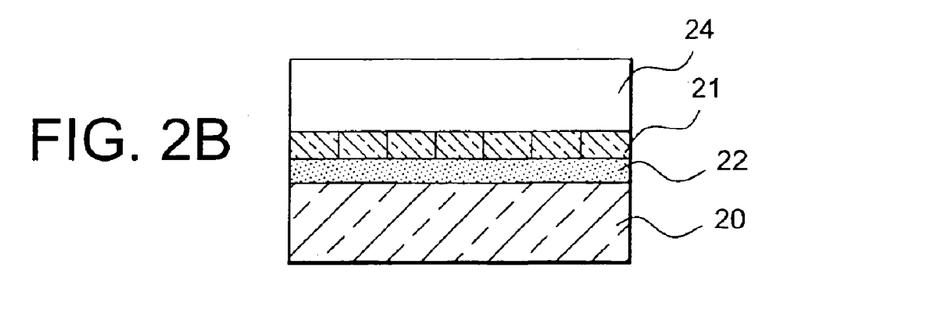

In that example, the chips 21 (for example: microelectronic devices, TFT transistor addressing circuits,) are meant to be transferred in a selective manner. The free surface of the chips 21 is then made interdependent with a transfer support 24 as shown in FIG. 2B. The transfer support 24 is glued on the free surface of the chips 21 without the presence of an additional layer.

Figure 2C:
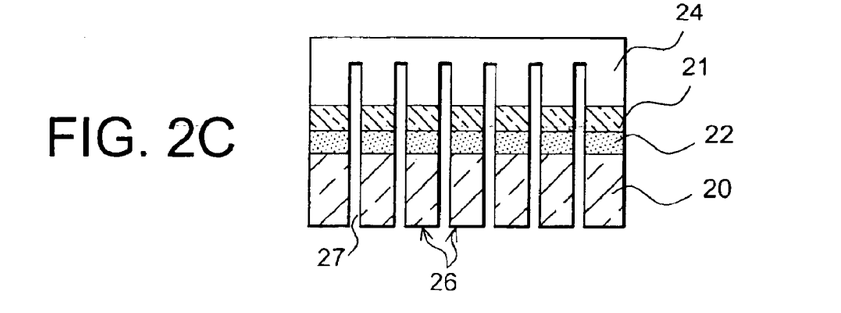

By way of cutting method chosen among mechanical cutting, laser cutting, partial cleaving, defect production, cleaving initiation, cuttings 27 are made in the initial support 20, including in the silica layer 22 and the thin layer, and partially in the transfer support 24, to have breaking zones remain. The cuttings 27 delimit labels 26, with each label including a chip. This is shown by FIG. 2C.

Figure 2D:
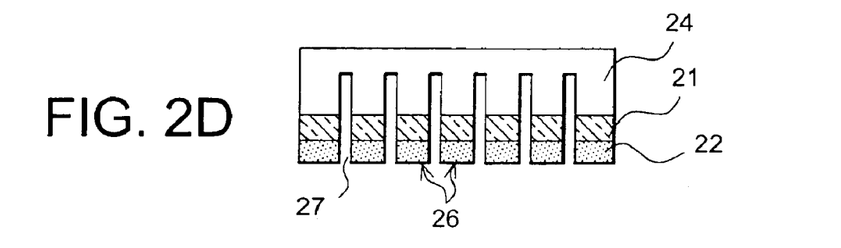
Figure 2E:
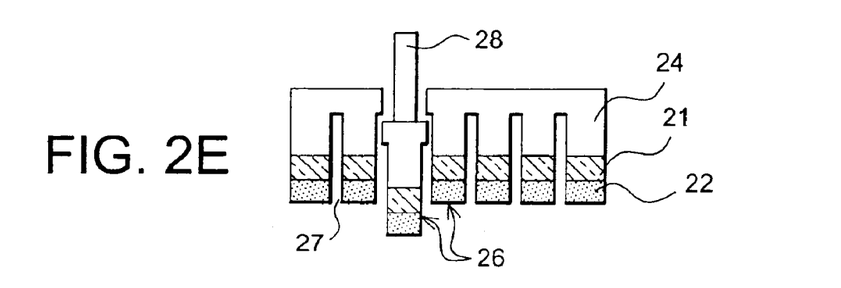
Figure 2F:
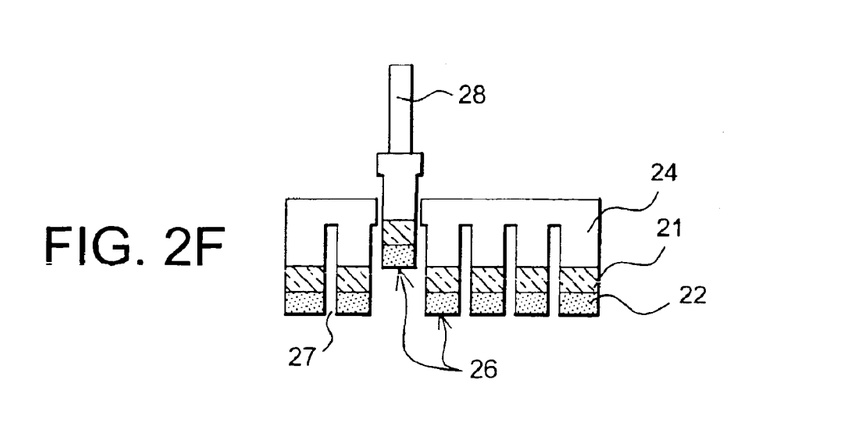

The massive part of the initial support 20 is then removed as shown in FIG. 2D. This removal can be carried out by a classical method or a combination of classical methods. We can mention as examples, mechanical rectification, polishing, dry or wet chemical attack. In that second example of application, the rectification can be used alone since the transfer face of each label does not need to be smooth to be glued.

The labels 26 to be transferred are taken selectively (see FIGS. 2E and 2F) and the breaking zones are broken by one of the methods mentioned in the first example of application. Preferably, the breaking is carried out by the pressure of a tool 28 enabling us to handle the label to be transferred, for example, a vacuum pliers.

Figure 2G:
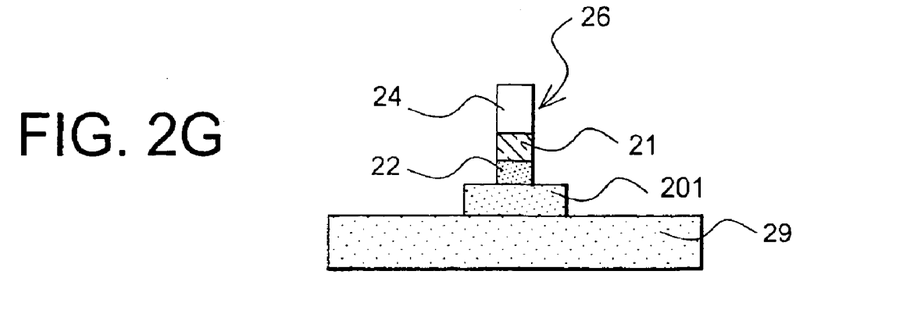
Figure 2H:
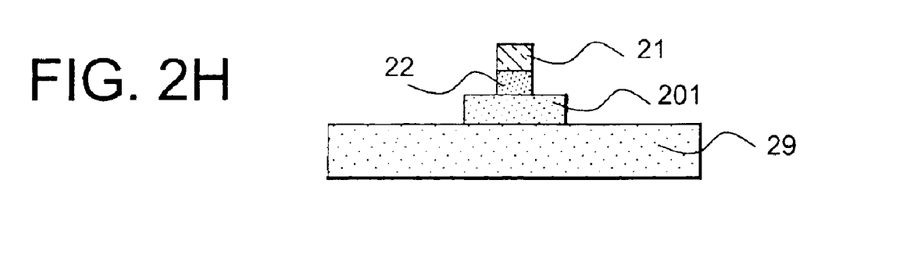

The label 26 taken is then glued on a receiving support or final support 29 through a glue block 201. This is shown in FIG. 2G. The final support 29 can be an organic material. It can be a card meant to receive an electronic circuit to make a smart card. We can choose a type of glue that can be removed by means of a solvent (for example a commercial wax or acetone).

The part of the transfer support 24 still present with the chip 21 transferred on the final support 29 can be removed by one of the methods mentioned in the first example of application. We get the structure shown in FIG. 2H.

Figure 2I:
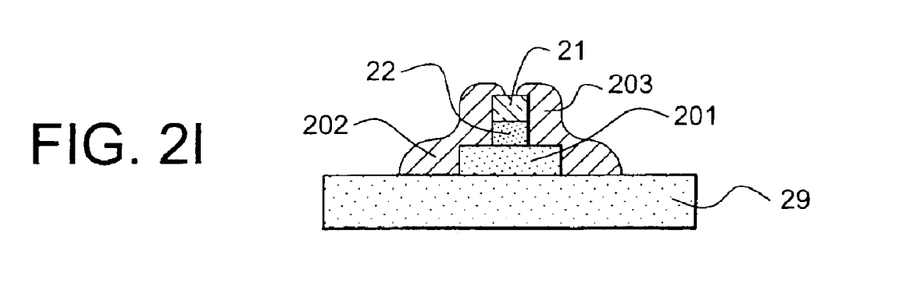

A technological supplement can then be made on the chip 21 transferred as shown in FIG. 2I, for example, by making metallic contacts 202 and 203 by a technique known in microelectronics.

A third example of application of the invention is illustrated by the FIGS. 3A to 3E that are partial section views.

Figure 3A:
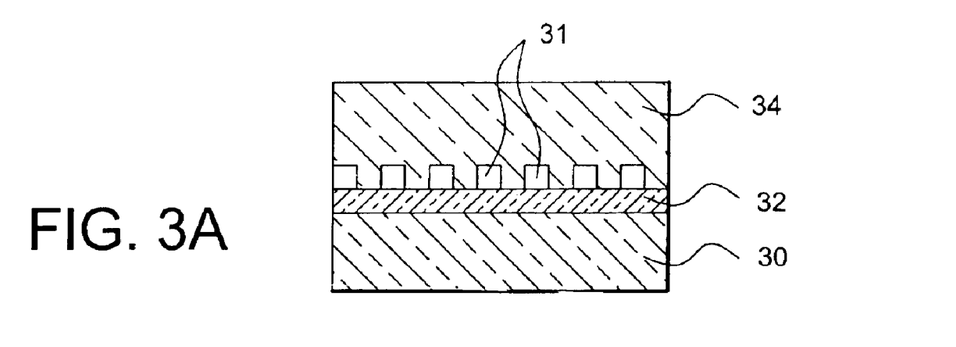
FIGS. 3A to 3E are transversal section views illustrating a third example of implementation of the selective transfer process according to the invention.

FIG. 3A shows a substrate 30 used as initial support. It can be a substrate of GaAs on which semiconducting chips have been made according to techniques known to the expert. At least one stoppage layer 32, for example, in $Al_xGa_{(1-x)}As$, separates the semiconducting chips from the substrate 30. That stoppage layer (or possibly those stoppage layers) provide the advantage of a better homogeneity in the transfer since it constitutes a stoppage layer and a sacrificial layer, for example, in relation to a dry or wet chemical engraving.

The semiconducting chips, in that example of application, are made up of basic elements 31 and supplementary elements grouped under the general reference 34. We can therefore say that the stoppage layer 32 and the basic elements 31 form the surface layer of the initial support while the set of supplementary elements 34 is used as a transfer support.

Figure 3B:
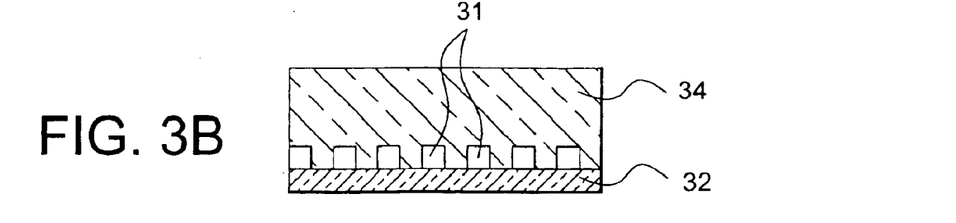

FIG. 3B shows that the initial support has been removed by a classical method or a combination of classical methods. We can mention, for example, mechanical rectification, polishing, dry or wet chemical attack.

Figure 3C:
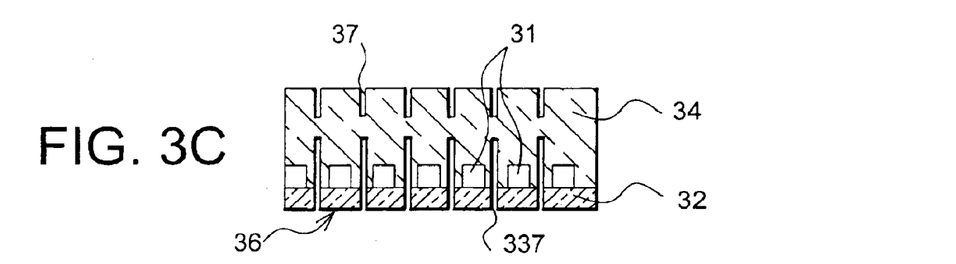
Figure 3D:
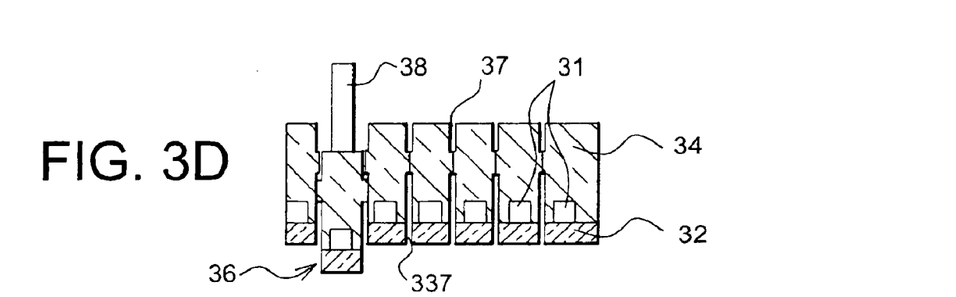

Labels to be transferred are then pre-cut by one of the methods mentioned in the preceding examples. FIG. 3C shows that the cuttings have been made from each free face of the structure. Cuttings 37 and 337, respectively in line, delimit labels 36 including one or several basic elements 31. There remains a breaking zone between each alignment of cuttings 37 and 337.

Labels 36 to be transferred are taken selectively (see FIG. 3D), breaking zones are broken by one of the methods mentioned in the first example of application. Preferably, the breaking is carried out by the sudden pressure of a tool 38 making it possible to handle the label to be transferred, for example, a vacuum pliers.

Figure 3E:
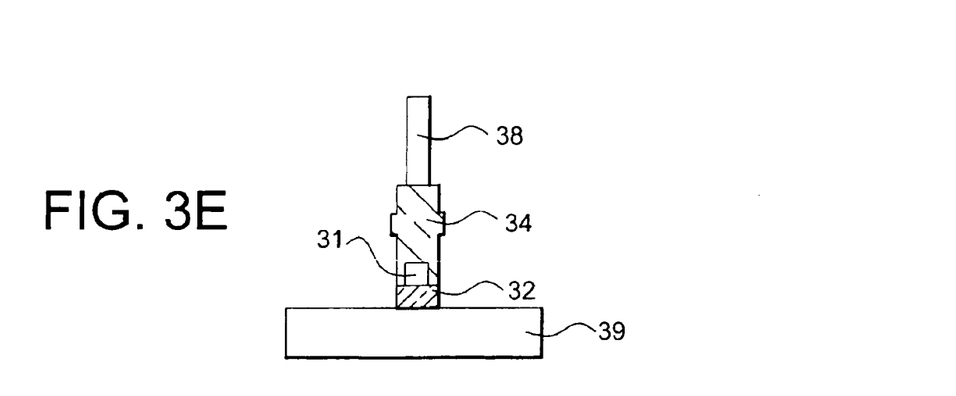

The label 36 taken is then glued on a receiving support or final support 39 by molecular adhesion and the tool 38 is removed. This is shown in FIG. 3E. The final support 39 may have been subjected to microelectronic surface preparations to improve the molecular adhesion of the label 36 on that support.

What is claimed is:

1. Process of selective transfer of labels from an initial support to a final support, each label including an element having at least one of a microelectronic, optoelectronic, acoustic, and mechanical device, the elements made in a surface layer of the initial support, the process comprising:
    fixing a transfer support on the surface layer of the initial support;
    removing a part of the initial support that does not correspond to the surface layer;
    laterally defining the labels, on a set made up of the transfer support and the surface layer, by cutting done according to a thickness of the surface layer, with the cutting being done at least in the surface layer to leave zones to be broken off;
    grasping at least one label to be transferred and tearing off by input of energy in the corresponding zone the set including the transfer support and the surface layer to be broken off, with the energy input resulting in the breaking off of these zones; and
    transferring and fixing the at least one label torn off on the final support.

2. Process according to claim 1, wherein the surface layer comprises an adhesion layer covering the elements, and wherein fixing comprises fixing the transfer support on the adhesion layer.

3. Process according to claim 2, wherein the adhesion layer comprises a double face adhesive film or material chosen among glue, wax, silicon oxide and silicon.

4. Process according to claim 3, wherein the glue comprises polyimide, BCB and epoxy or photosensitive resin.

5. Process according to claim 2, wherein the adhesion layer comprises a layer deposited and polished.

6. Process according to claim 1, wherein fixing is done by molecular adhesion.

7. Process according to claim 6, wherein the fixing by molecular adhesion is reinforced by a thermal treatment.

8. Process according to claim 1, wherein removing the part of the initial support that does not correspond to the surface layer is carried out by at least one of mechanical rectification, polishing, dry or wet chemical attack, and breaking along a weakened layer.

9. Process according to claim 1, cutting is done by dry or wet chemical engraving, sawing, ultrasounds, cleaving or laser beam.

10. Process according to claim 1, wherein grasping is carried out by at least one of mechanical means, capillarity, electrostatic means, pneumatic and chemical means.

11. Process according to claim 1, wherein input of energy is an input of at least one of mechanical, thermal and chemical energy.

12. Process according to claim 1, wherein tearing off is done by combining the effects of pressure and sucking up on the at least one label.

13. Process according to claim 1, wherein fixing is obtained by molecular adhesion or gluing.

14. Process according to claim 13, wherein fixing is obtained by gluing using at least one of glue, epoxy resin and a reactive or non-reactive metal layer.

15. Process according to claim 1, wherein the part of the transfer support that corresponds to the at least one label is removed at least partially.

16. Process according to claim 15, wherein the removal of the part of the transfer support is carried out by at least one of lift-off technique, chemical or selective attack of the adhesion layer, application of mechanical forces an breaking along a weakened layer.

17. Process according to claim 1, wherein the surface layer comprises at least a stoppage layer adjacent to the part of the initial support that does not correspond to the surface layer.

18. Process according to claim 17, further comprising:
removing the stoppage layer.

19. Process according to claim 1, further comprising:
testing at least one of the elements to determine a working of the at least one element.

20. Process according to claim 1, wherein fixing of the transfer support is obtained by depositing a layer of material on the surface layer, with that material layer forming the transfer support.

21. Process according to claim 1, wherein cutting is carried from at least one of the surface layer and the transfer support.

22. Process according to claim 1, wherein before the fixing on the final support of the at least one label a surface preparation is done to improve the fixing.

23. Process according to claim 1, wherein a stage is planned to reveal the presence of the active or passive microelectronic, optoelectronic device, or sensor of at least one of the elements.

24. Process according to claim 1, wherein the initial support is of the SOI type, including a silicon substrate bearing successively a silicon oxide layer and silicon layer in which at least one of the elements is made, the silicon oxide layer used as a stoppage layer.

25. Process according to claim 1, wherein during fixing on the final support, the label is aligned on the final support by using at least one of marks pre-established on the label and final support and by using a transfer support made of transparent material.

26. Process of selective transfer of labels from an initial support to a final support, each label including an element having at least one of a microelectronic, optoelectronic, acoustic, and mechanical device, the elements made in a surface layer of the initial support, the process comprising:

fixing a transfer support on the surface layer of the initial support;

removing a part of the initial support that does not correspond to the surface layer;

laterally defining the labels, on the set made up of the transfer support and the surface layer, by cutting done according to a thickness of the surface layer, with the cutting leaving zones to be broken off;

grasping at least one label to be transferred and tearing off the at least one label by input of energy in the corresponding zones to be broken off, with the energy input resulting in the breaking off of these zones; and transferring and fixing the at least one label torn off on the final support, wherein the transfer support comprises means to keep the transfer support rigid.

27. Process according to claim 26, wherein the means to keep the transfer support rigid is removed at least partially.

* * * * *

UNITED STATES PATENT AND TRADEMARK OFFICE
CERTIFICATE OF CORRECTION

PATENT NO. : 6,959,863 B2
DATED : November 1, 2005
INVENTOR(S) : Figuet et al.

It is certified that error appears in the above-identified patent and that said Letters Patent is hereby corrected as shown below:

Title page,
Item [73], should read:

-- [73] Assignee: Commissariat a l'Energie Atomique, Paris (FR) --.

Signed and Sealed this

Twenty-seventh Day of December, 2005

JON W. DUDAS
*Director of the United States Patent and Trademark Office*